United States Patent
Chen et al.

(10) Patent No.: US 11,393,799 B2
(45) Date of Patent: Jul. 19, 2022

(54) DEVICE FOR TRANSFER OF LIGHT EMITTING ELEMENTS, METHOD FOR TRANSFERRING LIGHT EMITTING ELEMENTS, AND METHOD OF MANUFACTURING THE TRANSFER DEVICE

(71) Applicant: Century Technology (Shenzhen) Corporation Limited, Shenzhen (CN)

(72) Inventors: Po-Liang Chen, New Taipei (TW); Yung-Fu Lin, New Taipei (TW); Jung-Hua Lee, Shenzhen (CN); Huihsien Tien, Shenzhen (CN)

(73) Assignee: Century Technology (Shenzhen) Corporation Limited, Shenzhen (CN)

(*) Notice: Subject to any disclaimer, the term of this patent is extended or adjusted under 35 U.S.C. 154(b) by 0 days.

(21) Appl. No.: 16/992,289

(22) Filed: Aug. 13, 2020

(65) Prior Publication Data
US 2021/0288031 A1 Sep. 16, 2021

(30) Foreign Application Priority Data
Mar. 10, 2020 (CN) .......................... 202010160027.2

(51) Int. Cl.
*H01L 25/075* (2006.01)
*H01L 33/00* (2010.01)
*H01L 21/677* (2006.01)

(52) U.S. Cl.
CPC ........ *H01L 25/0753* (2013.01); *H01L 33/005* (2013.01); *H01L 21/67709* (2013.01); *H01L 2933/0041* (2013.01); *H01L 2933/0066* (2013.01)

(58) Field of Classification Search
CPC combination set(s) only.
See application file for complete search history.

(56) References Cited

U.S. PATENT DOCUMENTS

| | | | | |
|---|---|---|---|---|
| 2013/0285086 | A1* | 10/2013 | Hu | H01L 24/75 438/34 |
| 2019/0304818 | A1* | 10/2019 | Ahn | B65G 47/91 |

FOREIGN PATENT DOCUMENTS

| | | |
|---|---|---|
| CN | 107808835 A | 3/2018 |
| CN | 107863316 A | 3/2018 |

* cited by examiner

*Primary Examiner* — Ratisha Mehta
(74) *Attorney, Agent, or Firm* — ScienBiziP, P.C.

(57) ABSTRACT

A device for collecting and transferring light emitting elements of microscale size includes a non-magnetic plate, a plurality of magnetic probes, and a magnetic plate. The non-magnetic plate defines through holes. Each of the probes is fixed in one through holes. The magnetic plate is on a surface of the non-magnetic plate and closes one opening of each of the through holes. The magnetic plate generates a magnetic field, so that each of the probes magnetically attracts one light emitting element. A method for making the transfer device and a method for transferring light emitting elements using the transfer device are also disclosed.

9 Claims, 16 Drawing Sheets

DEVICE FOR TRANSFER OF LIGHT EMITTING ELEMENTS, METHOD FOR TRANSFERRING LIGHT EMITTING ELEMENTS, AND METHOD OF MANUFACTURING THE TRANSFER DEVICE

FIELD

The subject matter herein generally relates to displays, and particularly relates to a device for transfer of light emitting elements, a method for transferring light emitting elements using the device, and a method of manufacturing the device.

BACKGROUND

The size of light emitting elements such as light emitting diodes (LEDs) are always tending towards smaller size, as a result, efficiently transferring a large number of light emitting elements to a target substrate is challenging.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
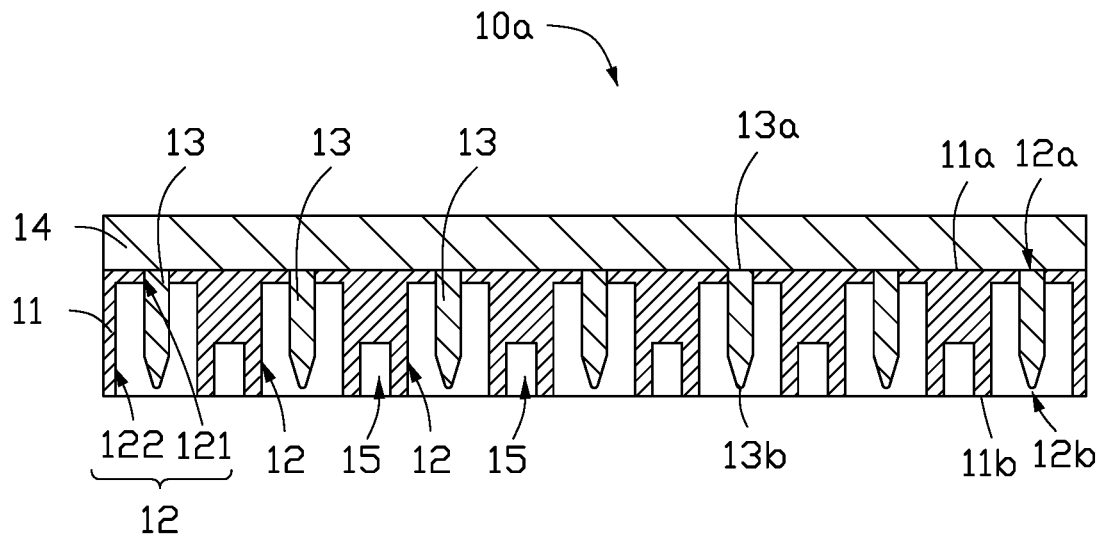
FIG. 1 is a cross-sectional view of a transfer device according to a first embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the Figures of the accompanying drawings in which like references indicate similar elements. It should be noted that references to "an" or "one" embodiment in this disclosure are not necessarily to the same embodiment, and such references can mean "at least one".

FIG. 1 is a cross-sectional view of a transfer device (transfer device 10a) according to a first embodiment. As shown in FIG. 1, the transfer device 10 a includes a non-magnetic plate 11, a plurality of probes 13, and a magnetic plate 14. The non-magnetic plate 11 is not reactive in relation to magnetism. The non-magnetic plate 11 has a first surface 11a and a second surface 11b opposite to the first surface 11a. The non-magnetic plate 11 defines a plurality of through holes 12 penetrating the first surface 11a and the second surface 11b. Each of the through holes 12 has first opening 12a formed in the first surface 11 a and a second opening 12b formed in the second surface 11b. Each of the probes 13 is fixed in one of the through holes 12 and does not extend out of the through holes 12. The magnetic plate 14 is on the first surface 11a of the non-magnetic plate 11 and closes the first opening 12a of each of the through holes 12. Each of the probes 13 is magnetic. The magnetic plate 14 generates a magnetic field, so that each of the probes 13 is capable of magnetically attracting one light emitting element 20.

Along a direction perpendicular to a thickness of the non-magnetic plate 11, a size of the second opening 12b of each of the through holes 12 is smaller than a size of the light emitting element 20, so that the light emitting element 20 is magnetically attracted against the second surface 11b of the non-magnetic plate 11 and does not fall into the through hole 12.

In the transfer device 10a, the magnetic plate 14 generates the magnetic field, so that each of the probes 13 in the through hole 12 can magnetically attract one light emitting element 20. The transfer device 10a can collect a large number of light emitting elements 20 at one time, thus the transfer of a large quantity of light emitting element 20 is achieved. In addition, since the size of the second opening 12b of the through hole 12 is smaller than the size of the light emitting element 20, the probe 13 in the through hole 12 does not exceed the through hole 12, so that the light emitting element 20 is magnetically attracted to the second surface 11b of the non-magnetic plate 11 and does not fall into or through the through hole 12 and suffering damage caused by the probe 13.

In one embodiment, the second surface 11b of the non-magnetic plate 11 defines a plurality of grooves 15. Each of the grooves 15 is between adjacent through holes 12 to reduce the influence of the magnetic field between adjacent through holes 12. Since the magnetic field generated by the magnetic plate 14 is weaker in air medium than in a medium of an insulating non-magnetic material, there are grooves 15 between adjacent through holes 12 so that the magnetic field is weaker at the grooves 15. Therefore, random motion of each light emitting element 20 during the collection process is reduced, avoiding deviations in placement, and this is beneficial to improve accurate placement of the light emitting element 20 during the transfer process.

In one embodiment, the magnetic plate 14 may be made of a magnetic material, such as an aluminum-nickel-cobalt permanent magnet alloy, an iron-chromium-nickel permanent magnet alloy, a permanent magnet ferrite, other rare earth permanent magnet materials, or a composite permanent magnet material composed of the above materials. In other embodiments, the magnetic plate 14 is an electromagnetic flat plate, which generates a magnetic field when energized.

In one embodiment, a material of the non-magnetic plate 11 may be, but is not limited to, polyimide-based composite material.

In one embodiment, the light emitting element 20 may be a conventional light emitting diode (LED), mini LED, or micro LED. "Micro LED" means LED with a grain size of fewer than 100 microns. The mini LED is also a sub-millimeter LED, and its size is between conventional LED and micro LED. "Mini LED" generally means LED with a grain size of about 100 microns to 200 microns.

In one embodiment, each light emitting element 20 includes a magnetic material layer 26 made of a magnetic material, such as an aluminum-nickel-cobalt permanent magnet alloy, an iron-chromium-nickel permanent magnet alloy, a permanent magnet ferrite, other rare earth permanent magnet materials, or a composite permanent magnet material composed of two or more of the above materials.

In one embodiment, each of the through holes 12 includes a receiving recess 122 penetrating the second surface 11b and a fixing hole 121 defined through a bottom of the receiving recess 122 and the first surface 11a. Along a direction perpendicular to the thickness of the non-magnetic plate 11, a size of the receiving recess 122 is larger than a size of the fixing hole 121. The magnetic plate 14 closes an opening of each fixing hole 121. Each of the probes 13 is fixed in one fixing hole 121 and extends to the receiving recess 122 without extending beyond the second surface 11b of the non-magnetic plate 11.

In one embodiment, each of the probes 13 has a first end surface 13a and a second end surface 13b opposite to the first end surface 13a. The second end surface 13b is the end surface of each probe 13 away from the magnetic plate 14. As shown in FIG. 1, a length of each of the probes 13 is less than or equal to the thickness of the non-magnetic plate 11. That is, the second end surface 13b of each probe 13 is in the through hole 12 or is flush with the second surface 11b of the non-magnetic plate 11, this protects the light emitting element 20 when magnetically attracted by the probe 13 from being damaged.

Figure 2:
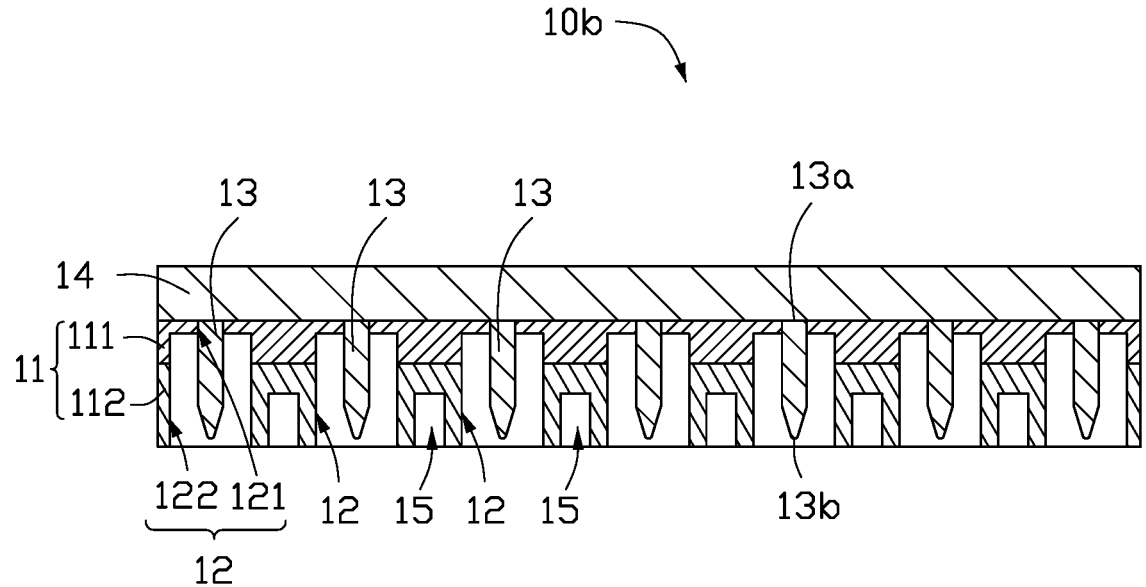
FIG. 2 is a cross-sectional view of a transfer device according to a second embodiment.

FIG. 2 is a cross-sectional view of a transfer device 10b according to a second embodiment. As shown in FIGS. 1 and 2, the difference between the transfer device 10b and the transfer device 10a is that the non-magnetic plate 11 of the transfer device 10b includes a first substrate 111 and a second substrate 112. That is, in the second embodiment, the nonmagnetic plate 11 is formed by two layers of substrates laminated together. The first substrate 111 has two sizes of through holes: the fixing holes 121 with a smaller size for fixing the probes 13, and the receiving recesses 122 with a larger size. Each of the probes 13 is fixed to one of the fixing holes 121 and extends beyond the first substrate 111. The second substrate 112 defines the receiving recesses 122 and the grooves 15.

In one embodiment, each of the receiving recesses 122 defined by the second substrate 112 is aligned with and in communication with one of the receiving recesses 122 in the first substrate 111. A size of the receiving recesses 122 defined by the second substrate 112 may be equal to or larger than that of a size of the receiving recess 122 defined by the first substrate 111.

Figure 3:
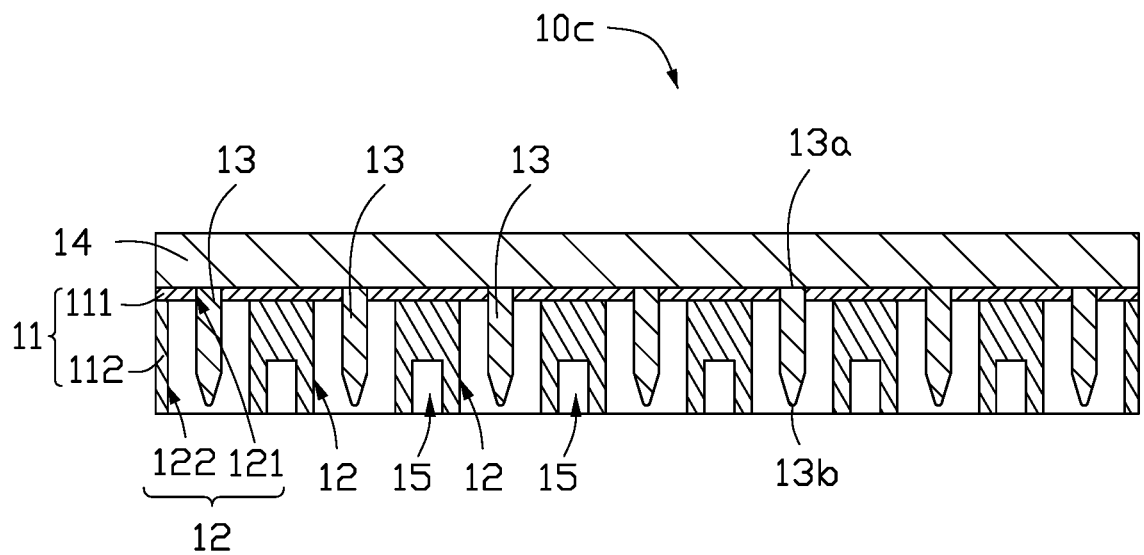
FIG. 3 is a cross-sectional view of a transfer device according to a third embodiment.

FIG. 3 is a cross-sectional view of a transfer device 10c according to a third embodiment. As shown in FIGS. 2 and 3, the difference between the transfer device 10c and the transfer device 10b is that the first substrate 111 of the transfer device 10c defines through holes 12 (i.e., a fixing hole 121) of one size, the second substrate 112 defines the receiving recesses 122 and the grooves 15. The receiving recesses 122 are aligned and communicate one-to-one with the fixing holes 121.

Figure 4:
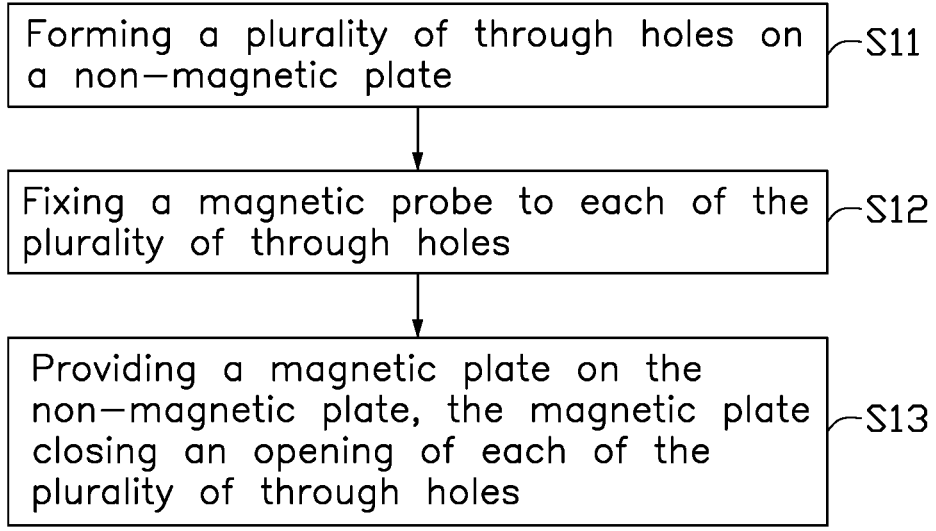
FIG. 4 is a flow chart of a method for making the transfer device according to a first embodiment.

Referring to FIG. 4, a flow chart of a method for making the transfer device 10a is disclosed. The method is provided by way of embodiment, as there are a variety of ways to carry out the method. The method described below can be carried out using the configurations illustrated in FIGS. 5 through 8, for example, and various elements of these figures are referenced in explaining the method. Each block shown in FIG. 4 represents one or more processes, methods, or subroutines, carried out in the method. Additionally, the illustrated order of blocks is by example only and the order of the blocks can change. The method can begin at Block S11.

Block S11: a plurality of through holes 12 are formed in a non-magnetic plate 11.

Block S12: a magnetic probe 13 is fixed in each of the through holes 12 of the non-magnetic plate 11.

Block S13: a magnetic plate 14 is provided on a surface of the non-magnetic plate 11. The magnetic plate 14 closes an opening of each of the through holes 12.

Figure 5:
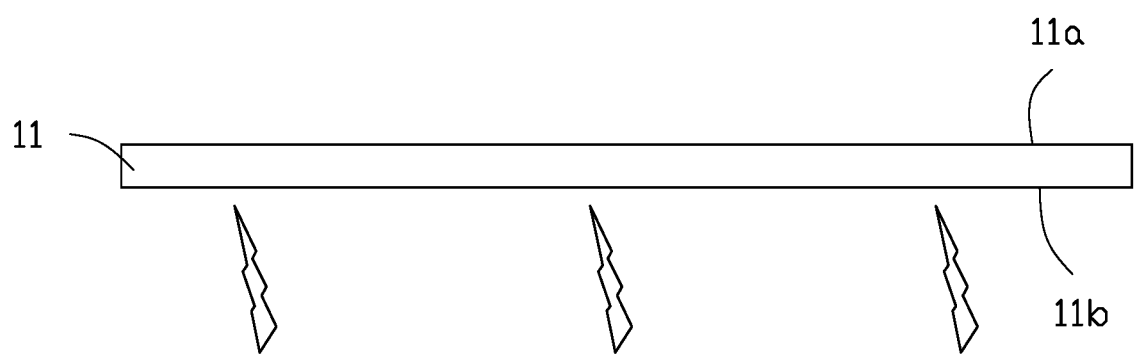
FIG. 5 shows a non-magnetic plate used in Block S11 of the method as disclosed in FIG. 4.

As shown in FIG. 5, the non-magnetic plate 11 is provided. In one embodiment, the through holes 12 may be formed in the non-magnetic plate 11 by laser patterning or by etching. The non-magnetic plate 11 has a first surface 11a and a second surface 11b opposite to the first surface 11a.

Figure 6:
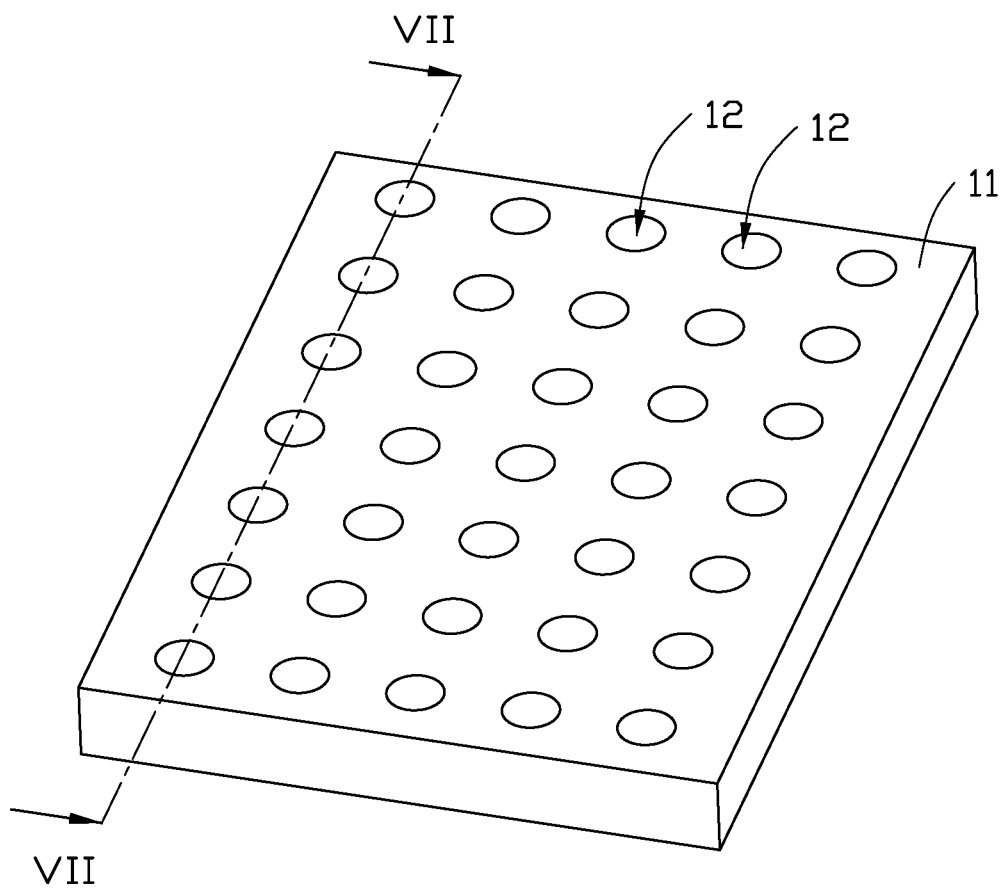
FIG. 6 is a diagrammatic view illustrating through holes formed in the non-magnetic plate of FIG. 5.

As shown in FIG. 6, the through holes 12 are arranged in an array. In one embodiment, each of the through holes 12 may have, but is not limited to, a round shape.

Figure 7:
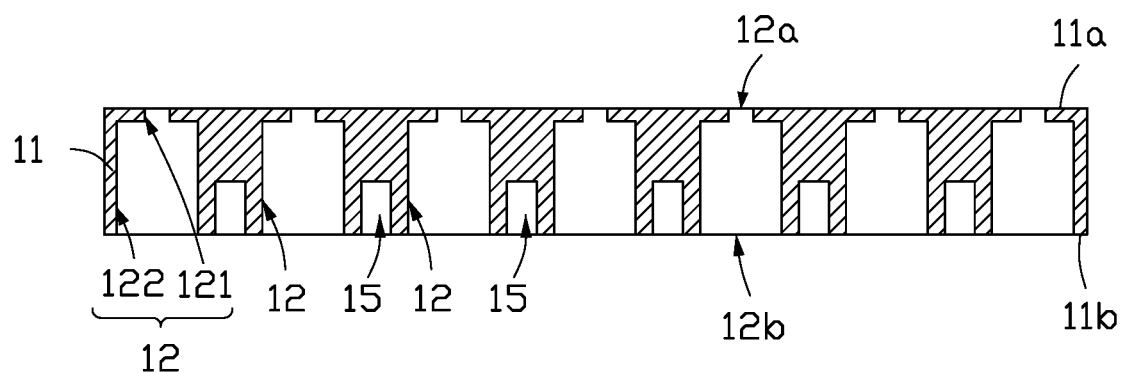
FIG. 7 is a cross-sectional view along line VII-VII of FIG. 6.

As shown in FIG. 7, each of the through holes 12 is stepped, which includes a fixing hole 121 with a smaller size and a receiving recess 122 with a larger size. Each of the through holes 12 penetrates the first surface 11a and the second surface 11b. Each of the through holes 12 has first opening 12a formed in the first surface 11a and a second opening 12b formed on the second surface 11b.

In one embodiment, after forming the through holes 12, the method further includes forming grooves 15 around each of the through holes 12.

Figure 8:
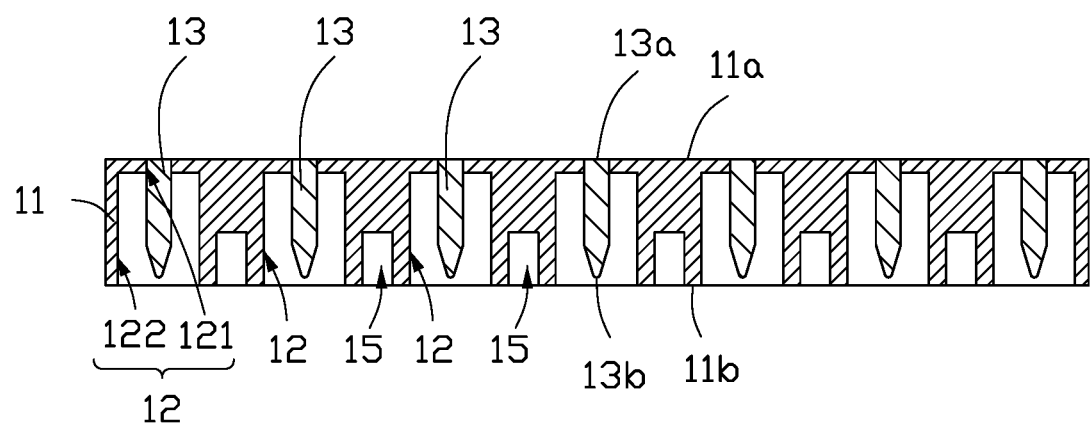
FIG. 8 is a cross-sectional view illustrating the result of applying Block S12 of the method as disclosed in FIG. 4.

As shown in FIG. 8, a plurality of magnetic probes 13 is provided, and each of the magnetic probes 13 is fixed in one of the through holes 12 without extending outside of the through holes 12. Each of the probes 13 has a first end surface 13a and a second end surface 13b opposite to the first end surface 13a.

In one embodiment, after each of the probes 13 is fixed in one of the through holes 12, the first end surface 13a of each probe 13 is in the fixing hole 121 and flush with the first surface 11a of the non-magnetic plate 11, and the second end surface 13b of each of the probes 13 is in the receiving recess 122 and flush with or not extending beyond the second surface 11b of the non-magnetic plate 11.

After each of the probes 13 is fixed in one of the through holes 12, the magnetic plate 14 is provided. The magnetic plate 14 is on the first surface 11a of the non-magnetic plate 11 and closes the first opening 12a of each through hole 12. Thereby, the transfer device 10a shown in FIG. 1 is obtained.

FIGS. 9 through 16 show steps of the method for making the transfer device 10b according to the second embodiment.

Figure 9:
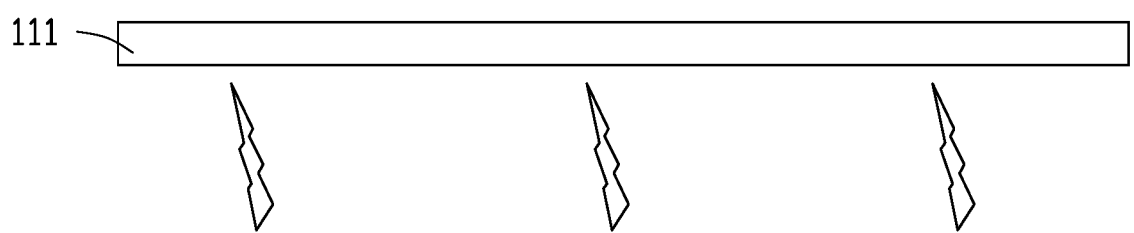
FIG. 9 shows a first substrate used in a method for making the transfer device according to a second embodiment.

As shown in FIG. 9, a first substrate 111 is provided. A material of the first substrate 111 is insulating and non-magnetic. In one embodiment, a plurality of through holes 12 may be formed in the first substrate 111 by laser patterning or etching.

Figure 10:
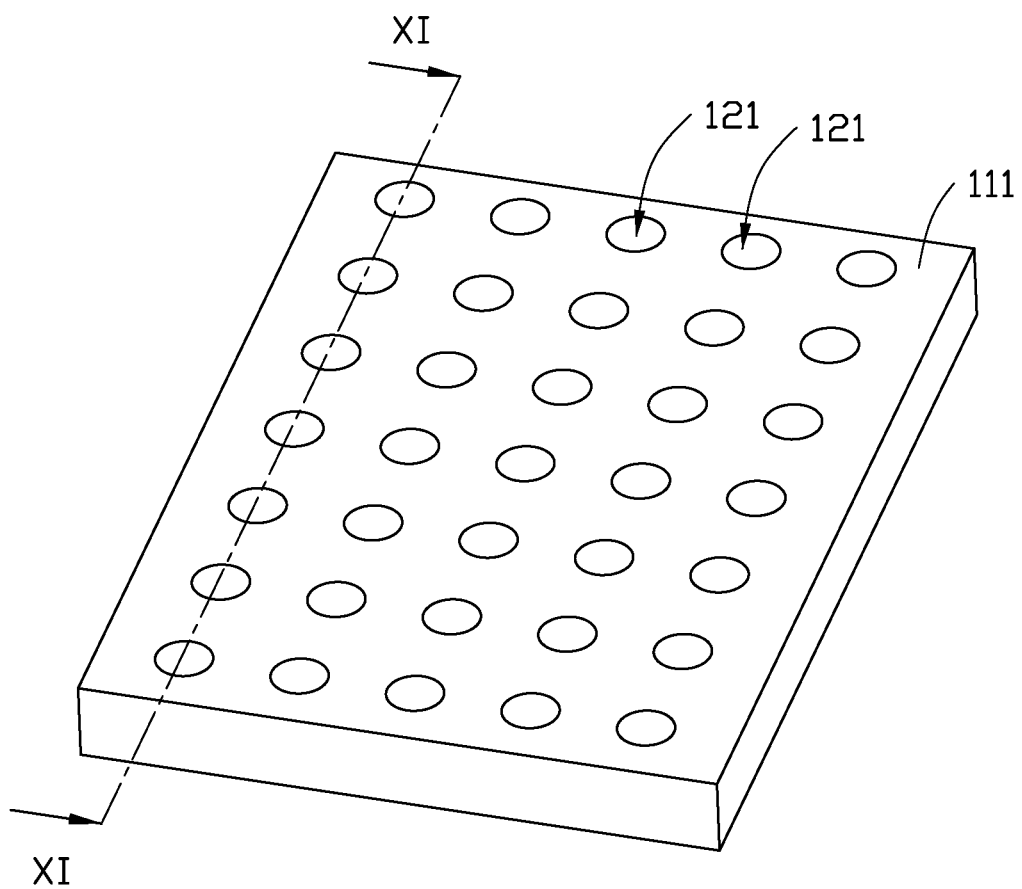
FIG. 10 is a diagrammatic view illustrating through holes formed in the first substrate of FIG. 9.

As shown in FIG. 10, the through holes 12 are arranged in an array. In one embodiment, the through hole 12 may be round in shape, but it is not limited thereto.

Figure 11:
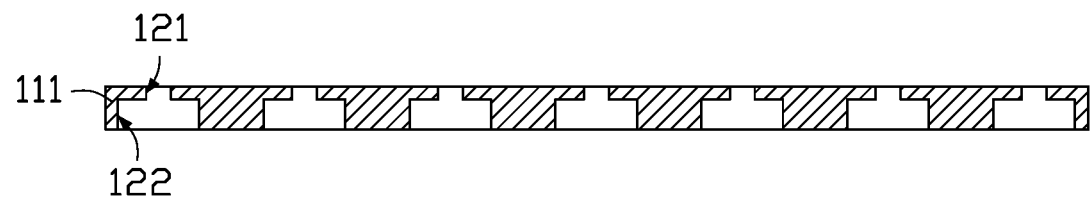
FIG. 11 is a cross-sectional view along line XI-XI of FIG. 10.

As shown in FIG. 11, each of the through holes 12 formed in the first substrate 111 may be one of two sizes. The smaller size is a fixing hole 121 for fixing the probe 13, and the larger size is a receiving recess 122.

Figure 12:
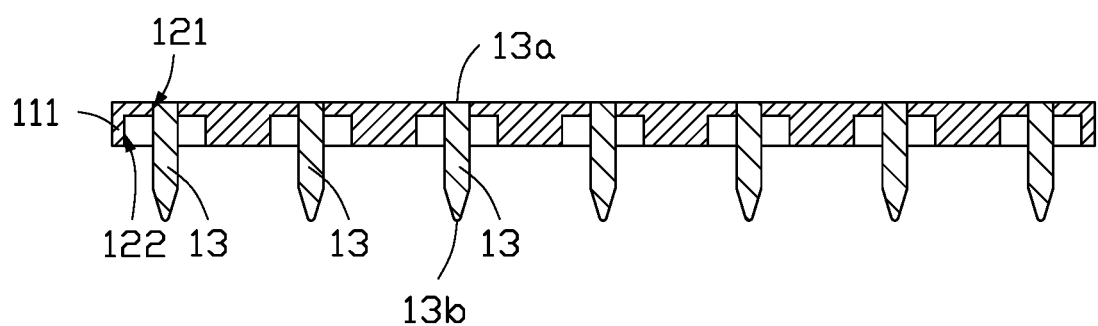
FIG. 12 is a cross-sectional view illustrating probes fixed in the through holes of the first substrate according to the second embodiment.

As shown in FIG. 12, a plurality of magnetic probes 13 is provided, and each of the probes 13 is fixed in one of the through holes 12. Each of the probes 13 has a first end surface 13a and a second end surface 13b opposite to the first end surface 13a. After probe 13 is fixed in one fixing hole 121, the first end surface 13a of each probe 13 is in the fixing hole 121 and flush with a surface of the first substrate 111, the second end surface 13b of each of the probes 13 extends beyond the receiving recess 122.

Figure 13:
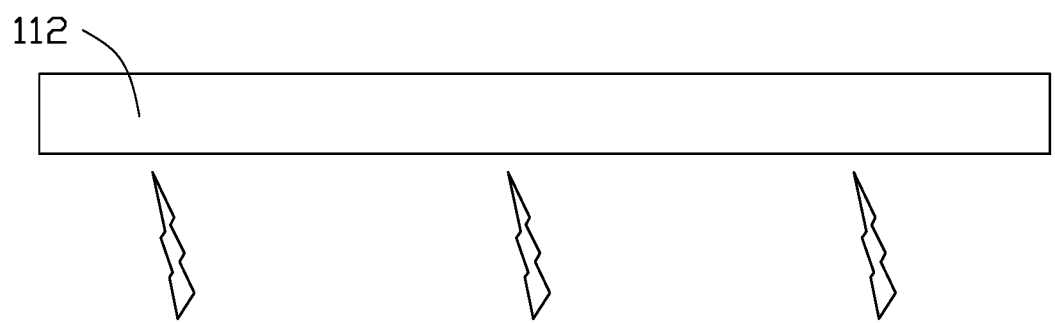
FIG. 13 shows a second substrate used in the method for making the transfer device according to the second embodiment.

As shown in FIG. 13, a second substrate 112 is provided. A material of the second substrate 112 is insulating and non-magnetic. In one embodiment, a plurality of receiving recesses 122 may be formed in the second substrate 112 by laser patterning or etching. The positions of the receiving recesses 122 on the second substrate 112 correspond to the positions of the fixing holes 121 on the first substrate 111.

Figure 14:
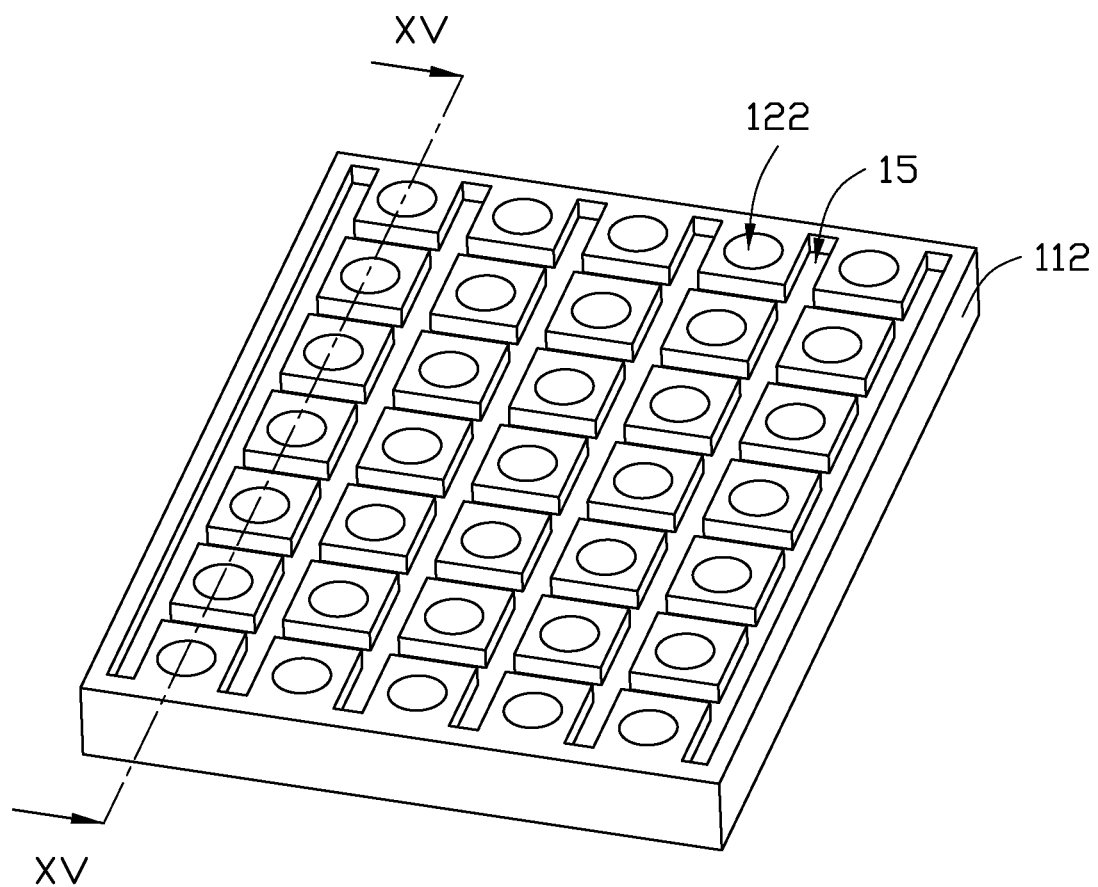
FIG. 14 is a diagrammatic view illustrating receiving recesses and grooves formed in the second substrate of FIG. 13.

As shown in FIG. 14, a plurality of receiving recesses 122 is arranged in an array. In one embodiment, the receiving recess 122 may be a round hole, but it is not limited thereto. The size of each receiving recess 122 on the second substrate 112 is greater than or equal to the size of each receiving recess 122 on the first substrate 111.

In addition, after forming the receiving recesses 122 on the second substrate 112, the method further includes forming a plurality of grooves 15 on the second substrate 112. Each of the grooves 15 is between adjacent receiving recesses 122. As shown in FIG. 14, the grooves 15 intersect each other horizontally and longitudinally to form a net or mesh structure.

Figure 15:
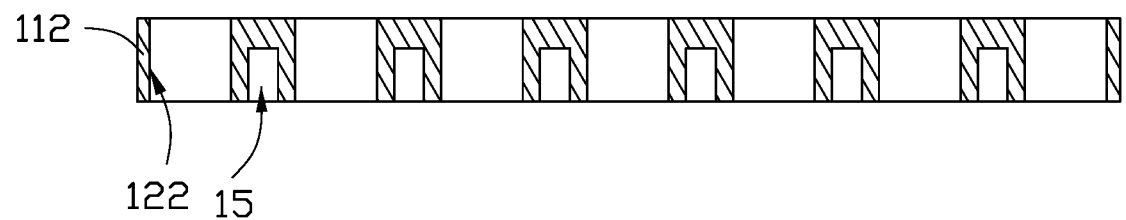
FIG. 15 is a cross-sectional view along line XV- XV of FIG. 14.

As shown in FIG. 15, each of the receiving recesses 122 penetrates opposite surfaces of the second substrate 112, and each of the grooves 15 is between adjacent receiving recesses 122.

Figure 16:
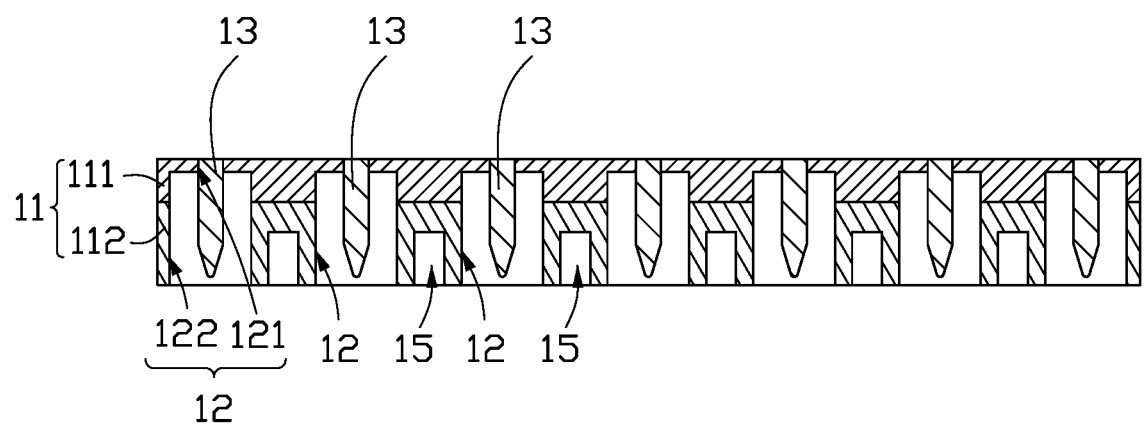
FIG. 16 is a cross-sectional view illustrating the first substrate and the second substrate bonded together according to the second embodiment.

As shown in FIG. 16, the first substrate 111 and the second substrate 112 are bonded. Each of the receiving recesses 122 on the second substrate 112 corresponds to one of the fixing holes 121 on the first substrate 111, and each of the probes 13 is inserted into one of the receiving recesses 122 on the second substrate 112.

In one embodiment, the first substrate 111 and the second substrate 112 may be made of insulating non-magnetic materials, such as organic materials, and the two are bonded by an adhesive. In other embodiments, the first substrate 111 and the second substrate 112 may be metal materials, and the two may be combined with indium.

After the first substrate 111 and the second substrate 112 are aligned and bonded, the magnetic plate 14 is provided. The magnetic plate 14 is on one side of the first substrate 111 and closes the opening of the fixing hole 121 on the first substrate 111. When the probe 13 contacts the surface of the magnetic plate 14, the transfer device 10b shown in FIG. 2 is obtained.

A method for making the transfer device 10c of the third embodiment differs from the method for making the transfer device 10b of the second embodiment in that in the step of forming the fixing holes 121 on the first substrate 111, no receiving recesses 122 are formed. That is, the first substrate 111 has through holes 12 (i.e., the fixing holes 121) of one size.

Figure 17:
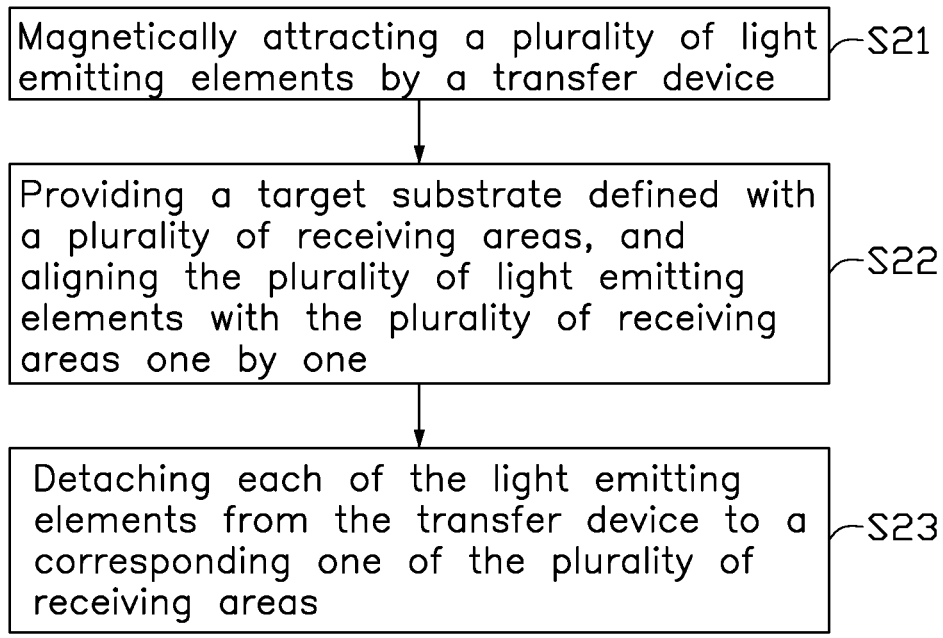
FIG. 17 is a flow chart of a method of transferring elements according to one embodiment.

Referring to FIG. 17, a flow chart of a method for transferring light emitting elements is disclosed. The method is provided by way of embodiment, as there are a variety of ways to carry out the method. The method described below can be carried out using the configurations illustrated in FIGS. 18 through 23, for example, and various elements of these figures are referenced in explaining the method. Each block shown in FIG. 17 represents one or more processes, methods, or subroutines, carried out in the method. Additionally, the illustrated order of blocks is by example only and the order of the blocks can change. The method can begin at Block S21.

Block S21: a plurality of light emitting elements 20 is magnetically attracted by the transfer device 10a, or 10b, or 10c.

Block S22: a target substrate 40 defining a plurality of receiving areas 41 is provided. The light emitting elements 20 and the receiving areas 41 are aligned one-to-one.

Block S23: each of the light emitting elements 20 is detached from the transfer device 10a-10c and transferred to one of the receiving areas 41 of the target substrate 40.

FIGS. 18 through 21 show steps of the method for transferring light emitting elements according to one embodiment. The method is described below using the transfer device 10b of the second embodiment.

Figure 18:
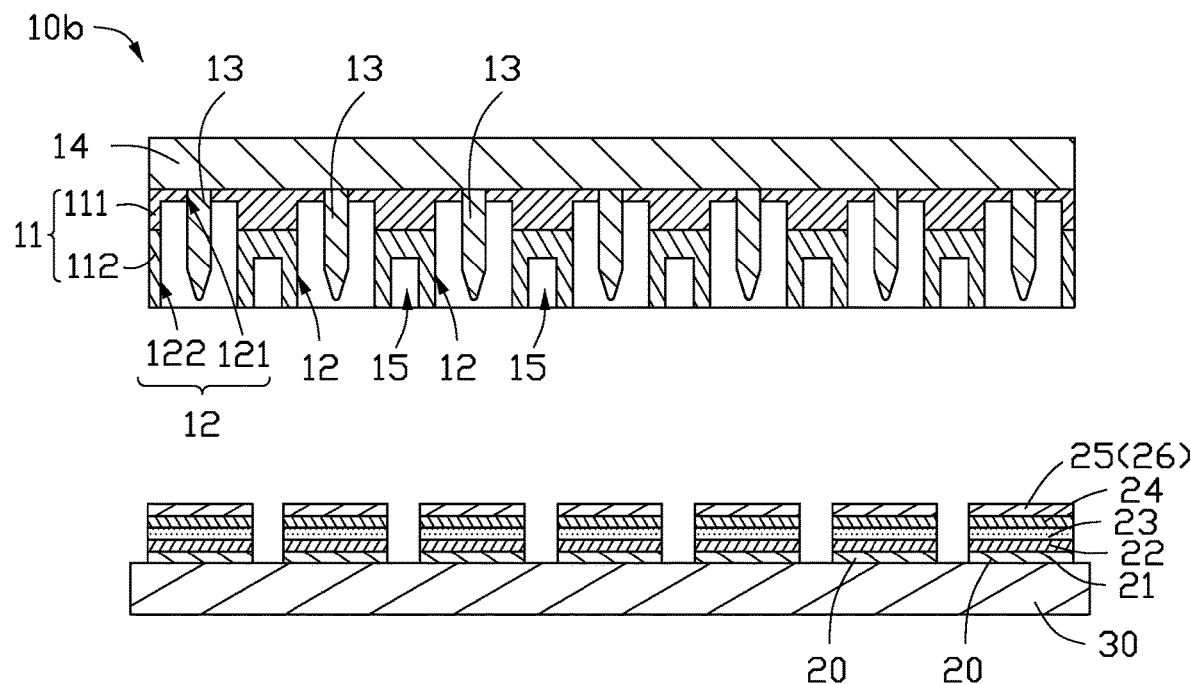
FIG. 18 and FIG. 19 are cross-sectional views illustrating the application of Block S21 of the method as disclosed in FIG. 17.

As shown in FIG. 18, the transfer device 10b and the light emitting elements 20 are provided. The light emitting elements 20 on a carrier substrate 30 are spaced apart from each other. Each of the light emitting elements 20 is arranged to correspond to one of the through holes 12. Each of the light emitting elements 20 includes a P-type doped phosphor layer 22, an active layer 23, and an N-type doped phosphor layer 24. The active layer 23 is between the P-type doped phosphor layer 22 and the N-type doped phosphor layer 24.

In one embodiment, the carrier substrate 30 may be a growth substrate of the light emitting elements 20, such as sapphire. In other embodiments, the carrier substrate 30 may also be a platform on which the light emitting elements 20 are placed.

In one embodiment, each light emitting element 20 includes a magnetic material layer 26 which is made of a magnetic material, such as an aluminum-nickel-cobalt permanent magnet alloy, an iron-chromium-nickel permanent magnet alloy, a permanent magnet ferrite, another rare earth permanent magnet material or composite permanent magnet material composed of the above materials.

In one embodiment, opposite ends of each light emitting element 20 carry a first electrode 21 and a second electrode 25. The first electrode 21 and the second electrode 25 are the magnetic material layer 26 having magnetic properties of opposing polarities. The P-type doped phosphor layer 22 is electrically connected to the first electrode 21, and the N-type doped phosphor layer 24 is electrically connected to the second electrode 25. That is, the first electrode 21 and the second electrode 25 are of opposing magnetic poles. For example, the magnetic pole of the first electrode 21 is N pole, the magnetic pole of the second electrode 25 is S pole, or the magnetic pole of the first electrode 21 is S pole, and the magnetic pole of the second electrode 25 is N pole.

In another embodiment, the magnetic material layer 26 does not serve as an electrode of the light emitting element 20. The magnetic material layers 26 having opposite magnetic polarities are respectively provided on the first electrode 21 and the second electrode 25 of each light emitting element 20.

In yet another embodiment, each light emitting element 20 is provided with the magnetic material layer 26 on only the first electrode 21 or only on the second electrode 25, and each light emitting element 20 on the carrier substrate 30 keeps the end with the magnetic material layer 26 facing up.

Figure 19:
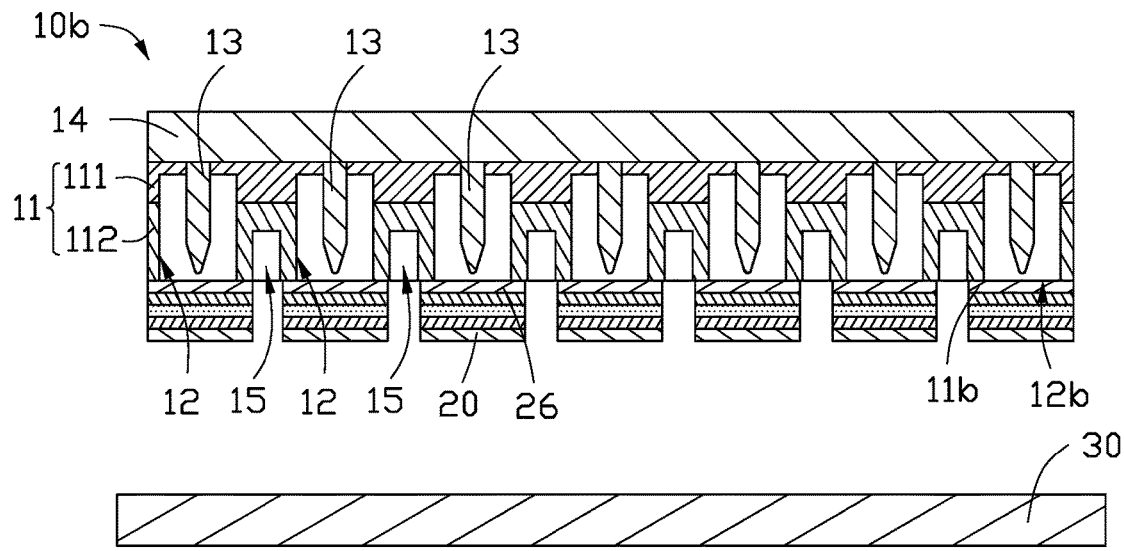

As shown in FIG. 19, each of the probes 13 magnetically attracts the magnetic material layer 26 on the light emitting element 20 under the magnetic field of the magnetic plate 14, so to attract one light emitting element 20.

In one embodiment, the magnetic plate 14 is magnetic, and the magnetic field generated by the magnetic plate 14 causes each probe 13 to magnetically attract the light emitting element 20 located below it.

Since the second opening 12b of the through hole 12 is smaller than the size of each light emitting element 20, as shown in FIG. 19, each light emitting element 20 is attracted by one of the magnetic probes 13 and comes to abut the second surface 11b of the non-magnetic plate 11 instead of falling into the through hole 12.

In addition, there are grooves 15 between adjacent through holes 12. The strength of the magnetic field at the position of the grooves 15 is weaker than that at the position of the through holes 12, the magnetic field is concentrated at the position of the through holes 12 instead of at the grooves 15. The accurate placement of each light emitting element 20 when it is adsorbed is guaranteed, so deviation is rare.

Figure 20:
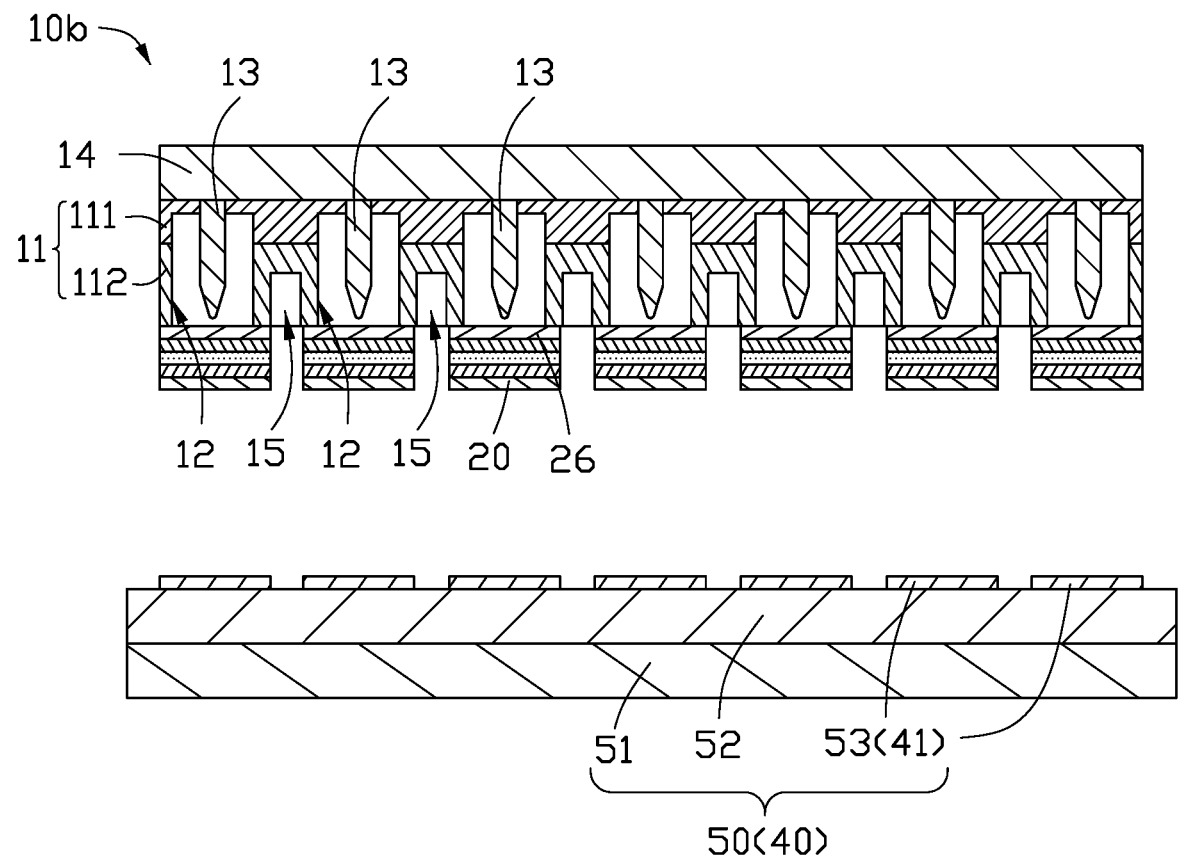
FIG. 20 is a cross-sectional view illustrating the application of Block S22 of the method as disclosed in FIG. 17.

As shown in FIG. 20, the target substrate 40 is provided. The target substrate 40 defines the receiving areas 41. Each of the receiving areas 41 is configured for receiving one of the light emitting elements 20. A surface of the transfer device 10b onto which the light emitting elements 20 are magnetically adsorbed is arranged to face a surface of the target substrate 40 defining the receiving areas 41. The light emitting elements 20 and the receiving areas 41 are aligned one by one.

In one embodiment, the target substrate 40 is a transfer substrate, and the light emitting element 20 is first transferred onto the target substrate 40 and then transferred to a driving substrate 50. In another embodiment, the target substrate 40 is the driving substrate 50. The driving substrate 50 is, for example, a thin film transistor substrate.

The step of providing the target substrate 40 includes providing a base layer 51, forming a driving circuit layer 52 (e.g., a thin film transistor array layer) on a side of the base layer 51, and forming a plurality of conductive blocks 53 on a side of the driving circuit layer 52 away from the base layer 51. The conductive blocks 53 are electrically connected to the driving circuit layer 52 and spaced apart from each other. Each of the conductive blocks 53 is defined as one receiving area 41.

In one embodiment, a material of the base layer 51 may be glass, quartz, silicon wafer, etc., or may be a flexible material such as polyimide (PI) or polyethylene terephthalate (PET).

Figure 21:
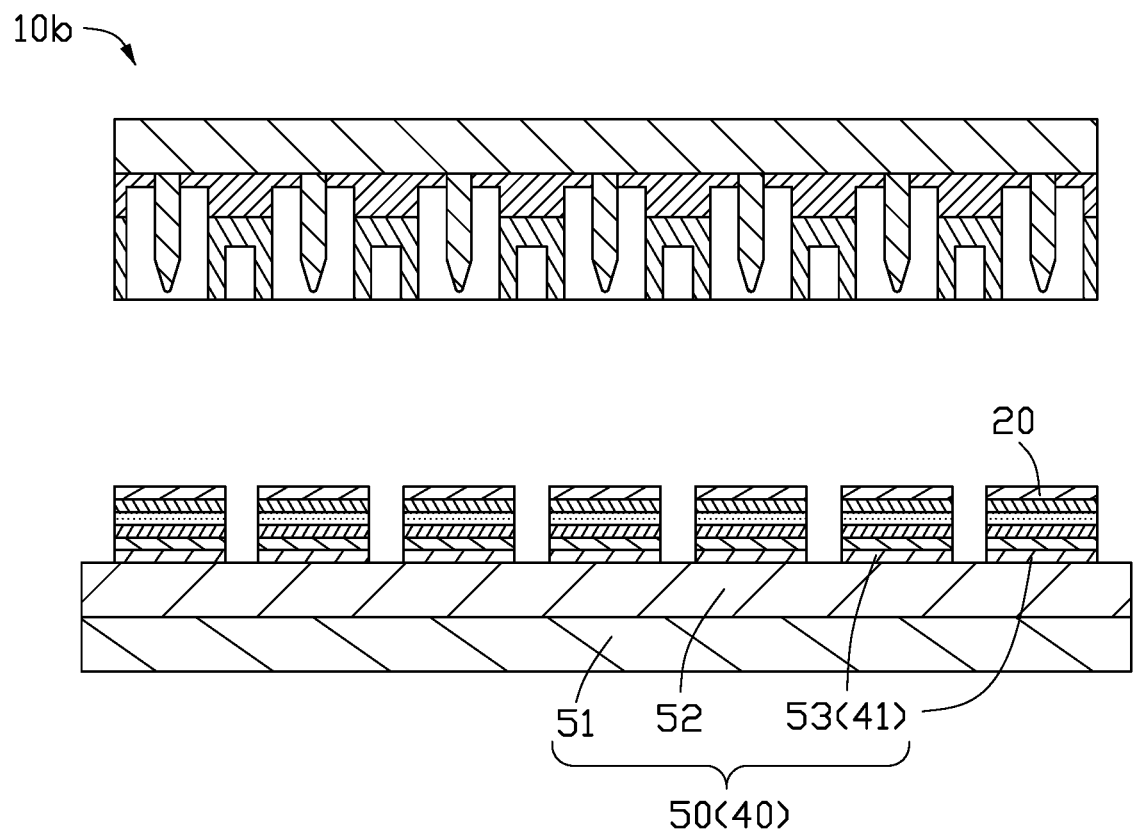
FIG. 21 is a cross-sectional view illustrating the application of Block S23 of the method as disclosed in FIG. 17.

As shown in FIG. 21, each of the light emitting elements 20 is detached from the transfer device 10b and transferred to one receiving area 41 of the target substrate 40.

In one embodiment, the magnetic plate 14 is made of a magnetic material. By arranging a magnetic plate with the same magnetic polarity as the magnetic plate 14 on a side of the target substrate 40 away from the transfer device 10b, the light emitting elements 20 are subjected to greater magnetic force on the side of the target substrate 40 away from the transfer device 10b and are detached from the transfer device 10b.

In other embodiments, the magnetic plate 14 can be turned over to reverse the magnetic polarities. For example, a side of the magnetic plate 14 close to the probes 13 can have a magnetic polarity opposing that of the light emitting elements 20, and a side of the magnetic plate 14 away from the probes 13 can have a same magnetic polarity as that of the light emitting elements 20. By turning over the magnetic plate 14, the magnetic plate 14 having the same magnetic polarity as the light emitting elements 20 is in contact with the probes 13, so that the light emitting elements 20 are repulsed by such magnetic field and are detached from the transfer device 10b.

In one embodiment, the magnetic plate 14 is an electro-magnetic plate. By applying an opposite current to the magnetic plate 14, each of the light emitting elements 20 is subjected to an opposing magnetic force and transferred to the corresponding receiving area 41. Alternatively, the magnetic plate 14 can be powered off, so each of the light emitting elements 20 is no longer subjected to magnetism, and be transferred to the corresponding receiving area 41 under the action of its own gravity.

Figure 22:
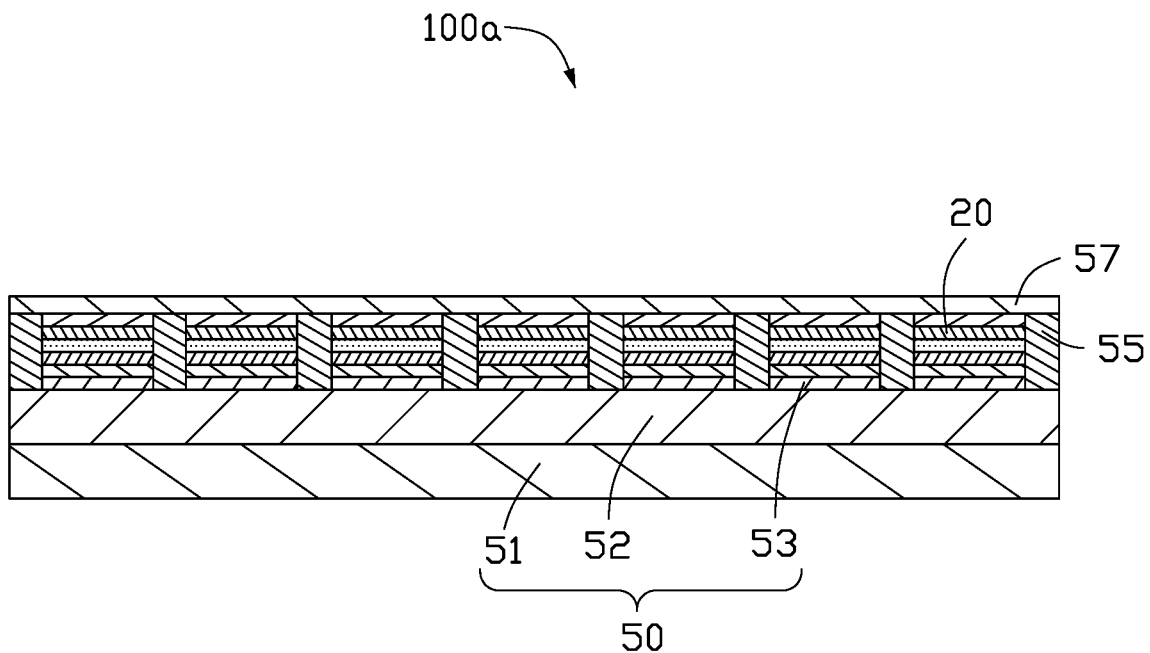
FIG. 22 is a cross-sectional view of a display device according to a first embodiment.

FIG. 22 is a cross-sectional view of a display device 100a according to a first embodiment. As shown in FIG. 22, the display device 100a includes the light emitting elements 20 and the driving substrate 50. Each of the light emitting elements 20 is electrically connected to the driving circuit layer 52 through one of the conductive blocks 53. The adjacent light emitting elements 20 are insulated and spaced from each other by one insulating block 55.

In one embodiment, the display device 100a further includes a cover 57 on a side of the light emitting elements 20 away from the driving substrate 50 to protect the circuit and the light emitting elements 20 from moisture.

In one embodiment, the light emitting elements 20 provided in Block S21 may be light emitting elements 20 which emit light of the same color, such as all light emitting elements 20 emitting red light, all light emitting elements 20 emitting green light, or all light emitting elements 20 emitting blue light, etc. The display device 100a is a monochrome display device 100a and can be used as in advertising, displaying indicator light, and so on.

In other embodiments, the light emitting elements 20 provided in Block S21 are light emitting elements 20 emitting different colors of light, the display device 100a being a color display device, and can be applied to mobile phones tablets computers, smart watches, and so on.

Figure 23:
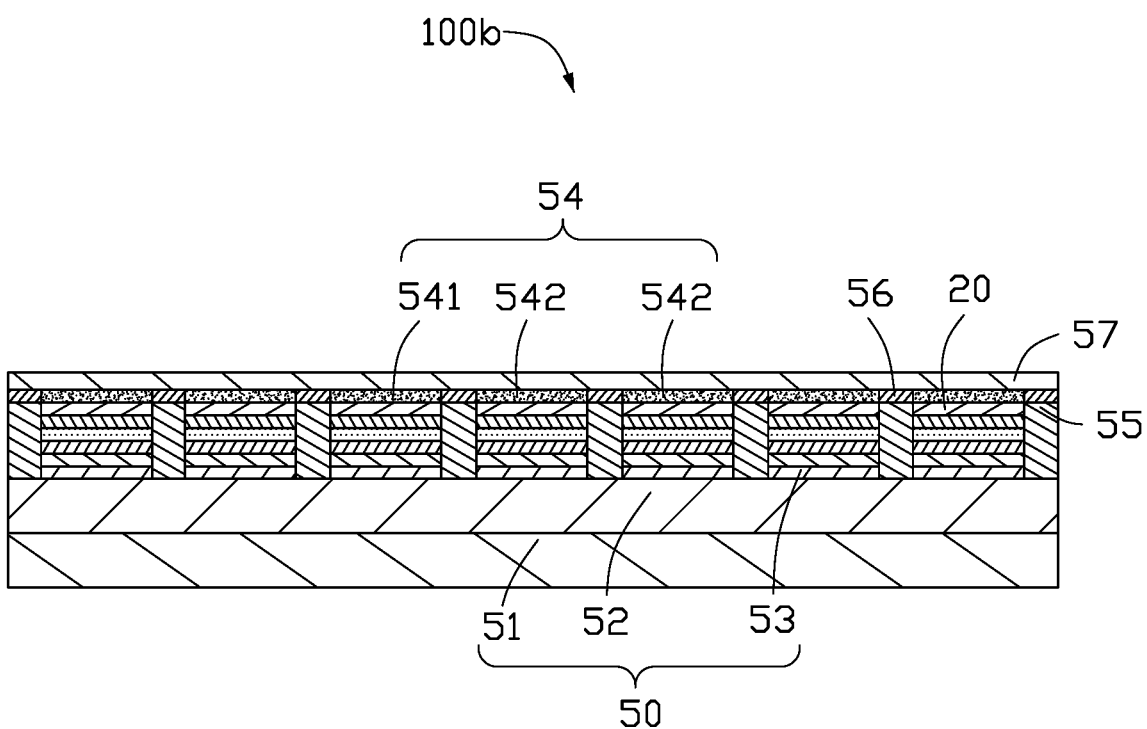
FIG. 23 is a cross-sectional view of a display device according to a second embodiment.

FIG. 23 is a cross-sectional view of a display device 100b according to a second embodiment. As shown in FIG. 23, the display device 100b differs from the display device 100a of the first embodiment in that in the second embodiment, the display device 100b further includes a wavelength conversion layer 54. Sub-pixels such as red pixels R, green pixels and blue pixels B can be defined on the driving substrate 50. The light emitting elements 20 are light emitting elements emitting light of a single color (e. g., blue light). That is, the method for transferring light emitting elements 20 further includes forming the wavelength conversion layer 54 on a side of the light emitting elements 20 away from the driving circuit layer 52. The wavelength conversion layer 54 includes a plurality of first wavelength conversion blocks 541, a plurality of second wavelength conversion blocks 542, and a plurality of third wavelength conversion blocks 543. Each wavelength conversion block is on a surface of one light emitting element 20 away from the driving substrate 50, and a black matrix 56 is provided between adjacent wavelength conversion blocks to prevent color crosstalk.

In one embodiment, a material of the wavelength conversion layer 54 may be quantum dots. For example, each of the light emitting elements 20 can be a diode emitting blue light, and the first wavelength conversion blocks 541, the second wavelength conversion blocks 542, and the third wavelength conversion blocks 543 may be quantum dots respectively for red color, for green color, and for blue color. The blue light emitted by the light emitting elements 20 undergoes wavelength conversion to realize color display of the display device 100b.

In other embodiments, the material of the wavelength conversion layer 54 may be photoresist. For example, each of the light emitting elements 20 is a diode emitting blue light, and the first wavelength conversion blocks 541, the second wavelength conversion blocks 542, and the third wavelength conversion blocks 543 may be each respectively made of a red photoresist, a green photoresist, and a blue photoresist. The blue light emitted by the light emitting elements 20 undergoes wavelength conversion to realize color display of the display device 100b.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A method for transferring light emitting elements, comprising:
    providing a plurality of light emitting elements, wherein one end of each of the plurality of light emitting elements has a magnetic material layer;
    providing a transfer device, wherein the transfer device comprises:
        a non-magnetic plate having a first surface and a second surface opposite to the first surface, the non-magnetic plate defining a plurality of through holes penetrating the first surface and the second surface, each of the plurality of through holes having a first opening formed in the first surface and a second opening being formed in the second surface;
        a plurality of magnetic probes, each of the plurality of magnetic probes being fixed in one of the plurality of through holes without extending beyond the one of the plurality of through holes; and
        a magnetic plate on the first surface of the non-magnetic plate and closing the first opening of each of the plurality of through holes;
        wherein the magnetic plate is operable to generate a magnetic field, allowing that each of the plurality of magnetic probes is capable of magnetically attracting one of the plurality of light emitting elements; and along a direction perpendicular to a thickness of the non-magnetic plate , a size of the second opening of each of the plurality of through holes is smaller than a size of each of the plurality of light emitting elements;
    providing a target substrate, wherein the target substrate defines a plurality of receiving areas, and each of the plurality of receiving areas is configured for receiving one of the plurality of light emitting elements;
    causing the magnetic plate to generate the magnetic field, wherein each of the plurality of magnetic probes magnetically adsorbs the magnetic material layer of one of the plurality of light-emitting elements under the magnetic field to adsorb one of the plurality of light-emitting elements;
    facing a surface of the transfer device on which the plurality of light emitting elements are magnetically adsorbed to a surface of the target substrate defining the plurality of receiving areas;
    aligning the plurality of the light emitting elements with the plurality of the receiving areas one by one; and
    separating and transferring each of the plurality of light emitting elements from the transfer device to a corresponding one of the receiving areas of the target substrate.

2. The method for transferring light emitting elements according to claim 1, wherein providing the transfer device comprises a plurality of grooves on the second surface of the non-magnetic plate, wherein each of the plurality of grooves is betwen adjacent ones of the plurality of through holes.

3. The method for transferring light emitting elements according to claim 1, wherein forming the plurality of through holes further comprises forming a receiving recess penetrating the second surface and forming a fixing hole defined through a bottom of the receiving recess and the first surface;
    along a direction perpendicular to the thickness of the non-magnetic plate, a size of the receiving recess is larger than a size of the fixing hole; and one end of each of the plurality of probes is fixed in one fixing hole, and the other end of each of the plurality of probes is received in the receiving recess.

4. The method for transferring light emitting elements according to claim 3, wherein providing the non-magnetic plate further comprises: providing a first substrate having a plurality of the fixing holes, providing a second substrate having a plurality of the receiving recesses, and bonding the first substrate and the second substrate.

5. The method for transferring light emitting elements according to claim 3, wherein providing the non-magnetic plate further comprises: providing a first substrate having a plurality of the fixing holes and a plurality of the receiving recesses, providing a second substrate having a plurality of the receiving recesses, and bonding the first substrate and the second substrate.

6. The method for transferring light emitting elements according to claim 1, wherein providing the target substrate comprises providing a base layer, forming a driving circuit layer on a side of the base layer, and forming a plurality of conductive blocks on a side of the driving circuit layer away from the base layer, the plurality of conductive blocks is the plurality of receiving areas.

7. The method for transferring light emitting elements according to claim 6, wherein the plurality of light emitting elements light emitting elements emitting light of the same color, and the method further comprises forming a wavelength conversion layer on a side of the plurality of light emitting elements away from the driving circuit layer.

8. The method for transferring light emitting elements according to claim 7, wherein a material of the wavelength conversion layer is quantum dots.

9. The method for transferring light emitting elements according to claim 7, wherein a material of the wavelength conversion layer is photoresist.

* * * * *